(12) United States Patent
Adams et al.

(10) Patent No.: US 7,983,080 B2
(45) Date of Patent: Jul. 19, 2011

(54) NON-BODY CONTACTED SENSE AMPLIFIER WITH NEGLIGIBLE HISTORY EFFECT

(75) Inventors: Chad A. Adams, Byron, MN (US); Sharon H. Cesky, Rochester, MN (US); Elizabeth L. Gerhard, Rochester, MN (US); Jeffrey M. Scherer, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 196 days.

(21) Appl. No.: 12/364,023

(22) Filed: Feb. 2, 2009

(65) Prior Publication Data
US 2010/0195408 A1 Aug. 5, 2010

(51) Int. Cl.
*G11C 16/04* (2006.01)
(52) U.S. Cl. ............... 365/185.05; 365/205; 365/207

(58) Field of Classification Search ............ 365/189.05, 365/205, 207
See application file for complete search history.

(56) References Cited

U.S. PATENT DOCUMENTS

| | | | |
|---|---|---|---|
| 6,798,701 B2 * | 9/2004 | Yamazaki | 365/189.05 |
| 7,408,814 B2 * | 8/2008 | Vali et al. | 365/189.05 |
| 7,710,782 B2 * | 5/2010 | Chen et al. | 365/185.21 |

\* cited by examiner

*Primary Examiner* — Pho M Luu
(74) *Attorney, Agent, or Firm* — Bockhop & Associates, LLC

(57) ABSTRACT

In a method of mitigating hysteresis effect in a sense amplifier circuit, a data value is sensed from a data source with the sense amplifier during a first period. The data value is stored in a latch. The data valued stored in the latch is inverted, thereby generating an inverted data value. The data source is isolated from the sense amplifier and the inverted data value is read with the sense amplifier during a second period immediately following the first period.

19 Claims, 3 Drawing Sheets

NON-BODY CONTACTED SENSE AMPLIFIER WITH NEGLIGIBLE HISTORY EFFECT

BACKGROUND OF THE INVENTION

1. Field of the Invention

The present invention relates to digital memory circuits and, more specifically, to a a sense amplifier SRAM that mitigates the hysteresis effect.

2. Description of the Prior Art

Most digital computers use some sort of memory circuit to store data values during processing. Static random access memory (SRAM) is a semiconductor memory, used in digital computers and similar applications, that does not require periodic refreshing in order to maintain a data value over time. A typical array of SRAM circuits includes an array of bi-stable latching circuits to store data values.

One type of SRAM employs a sense amplifier SRAM, which is a memory device that uses cross-coupled devices to detect differential signals. This type of SRAM includes a memory cell that generates both a true data value being stored and a compliment of the true data value. In silicon on insulator (SOI) technologies, sense amplifier SRAMs exhibit a hysteresis effect (also referred to as "history effect"), in which on each read of a "one" or a "zero" the voltage of the bodies of the cross coupled devices will drift slightly apart. If one value (e.g., a "1") is read repeatedly over a long period of time, then the bodies of the cross-coupled devices can drift apart by 10% or more, thereby increasing the bitline signal margin needed to sense the correct state. In certain scenarios, the hysteresis effect can result in read failures.

One existing solution to this problem is the use of body-contacted devices which would hold the bodies of the cross-coupled devices to a known value. However, this solution has an impact on chip area and is prone to process variations.

Therefore, there is a need for a method and circuit that mitigates the hysteresis effect without the use of body contacted devices.

SUMMARY OF THE INVENTION

The disadvantages of the prior art are overcome by the present invention which, in one aspect, is a method of mitigating hysteresis effect in a sense amplifier circuit in which a data value is sensed from a data source with the sense amplifier during a first period. The data value is stored in a latch. The data valued stored in the latch is inverted, thereby generating an inverted data value. The data source is isolated from the sense amplifier and the inverted data value is read with the sense amplifier during a second period immediately following the first period.

In another aspect, the invention is a circuit for reading a data value from a memory device that outputs a true data signal and a complement data signal. The compliment data signal corresponds to a compliment of the true data signal. A sense amplifier is responsive to a sense signal and has a first sense amplifier input and a second sense amplifier input. The sense amplifier is configured to sense a voltage differential between the first sense amplifier input and the second sense amplifier input when a sense signal is asserted. The sense amplifier is also configured to set a sensed data value to a first state when the voltage differential is greater than a predetermined threshold and is configured to set the sensed data value to a second state, different from the first state, when the voltage differential is not greater that the predetermined threshold. A latch is configured to store the sensed data value and generate a latch output representative of the sensed data value stored therein. A coupling device is configured to couple the first sense amplifier input to the true data signal and couple the second sense amplifier input to the complement data signal during a first sense operation. The coupling device is also configured to isolate the first sense amplifier input from the true data signal and isolate the second sense amplifier input from the complement data signal after the first data sense operation. The coupling device is also configured to couple the first sense amplifier input to a compliment of the latch output and couple the second sense amplifier input to the latch output after the first sense operation and prior to a subsequent data sense operation.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

Figure 1:
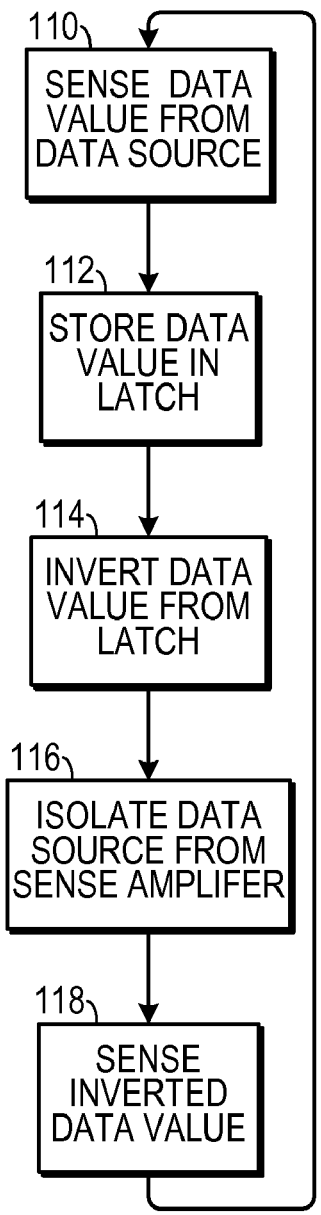
FIG. 1 is a flow chart showing one embodiment of a method of reducing hysteresis in a sense amplifier.

A preferred embodiment of the invention is now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on."

One embodiment uses a typical sense amplifier circuit with a circuit that switches the state of the cross-coupled devices after every read to the opposite data. The purpose of this is to equalize the hysteresis in the sense amplifier and thereby eliminate the need for body contacts.

As shown in FIG. 1, a data value is sensed with a sense amplifier 110 from a data source (such as a static random access memory) upon the assertion of a sense signal. The sensed data value is stored in a latch 112 and the data from the latch is inverted 114. The sense amplifier is isolated from the data source 116 and the inverted data from the latch is sensed by the sense amplifier 118 upon a second assertion of the sense signal.

The output from the sense amplifier is latched and inverted before being fed back to the sense amplifier and sensed again during a bitline precharge phase. The inverted data is gated by a "refresh" signal. In this way the sense amplifier's state can be switched after every read, thereby correcting any drift on the bodies of the cross-coupled devices. This circuit and methodology has minimal cost in area and is relatively free from the affects of process variation. It also has an advantage in that no body-contacted devices are necessary.

The system operates normally during the first half of the read cycle, with a "precharge" signal turning off and the sense signal amplifying the bitline differential after a period of time. However, unlike a traditional sense scheme, a write back occurs in the bitline precharge phase by using the inverted data from the first half-cycle.

Immediately upon reading the data in the first half-cycle, the circuit precharges for a second time. After the "precharge" signal again turns off, a second sense takes place with the refresh signal turned on to allow the inverted data onto the isolated "blc" and "blt" nodes (as will be discussed more fully below). This data switches the state of the body voltages on the sense amplifier and mitigates any charge migration on these nodes. The next read cycle begins with the bit lines again precharged and the process repeats.

Figure 2:
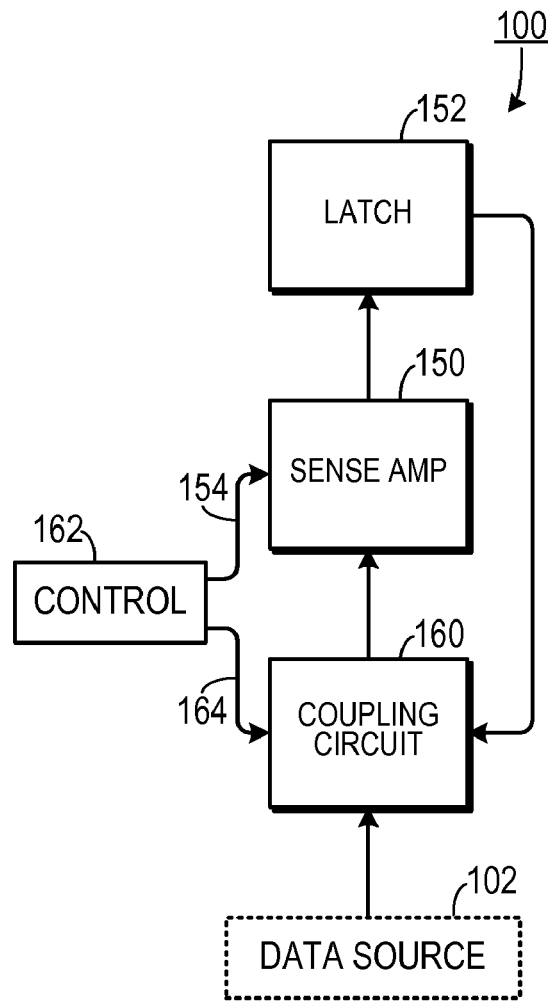
FIG. 2 is a schematic diagram of a memory sensing system.
Figure 4:
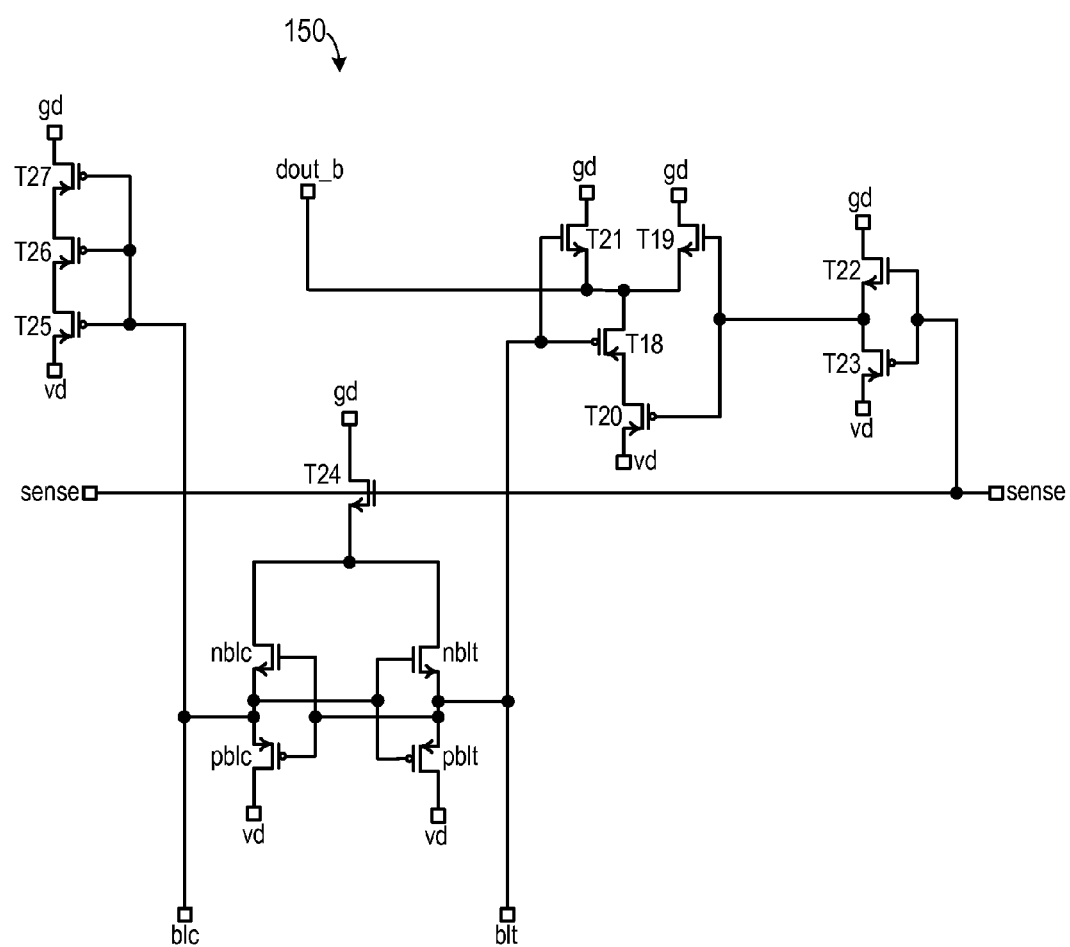
FIG. 4 is a circuit diagram showing one embodiment of a sense amplifier employed with the circuit shown in FIG. 3.

As shown in FIG. 2, one embodiment of a circuit 100 that executes this method includes a sense amplifier 150 (a more detailed drawing of the sense amplifier 150 is shown in FIG. 4) that senses data from a data source 102 when a sense signal 154 from a control circuit 162 is asserted. The sense amplifier 150 also outputs data to a latch 152. A coupling device 160 inverts the data from the latch 152 and, in response to a signal 164 from the control circuit 162, isolates the data source 102 from the sense amplifier 150. The control circuit 162 then reasserts the sense signal 154, thereby causing the sense amplifier 150 to sense the inverted data value.

Figure 3:
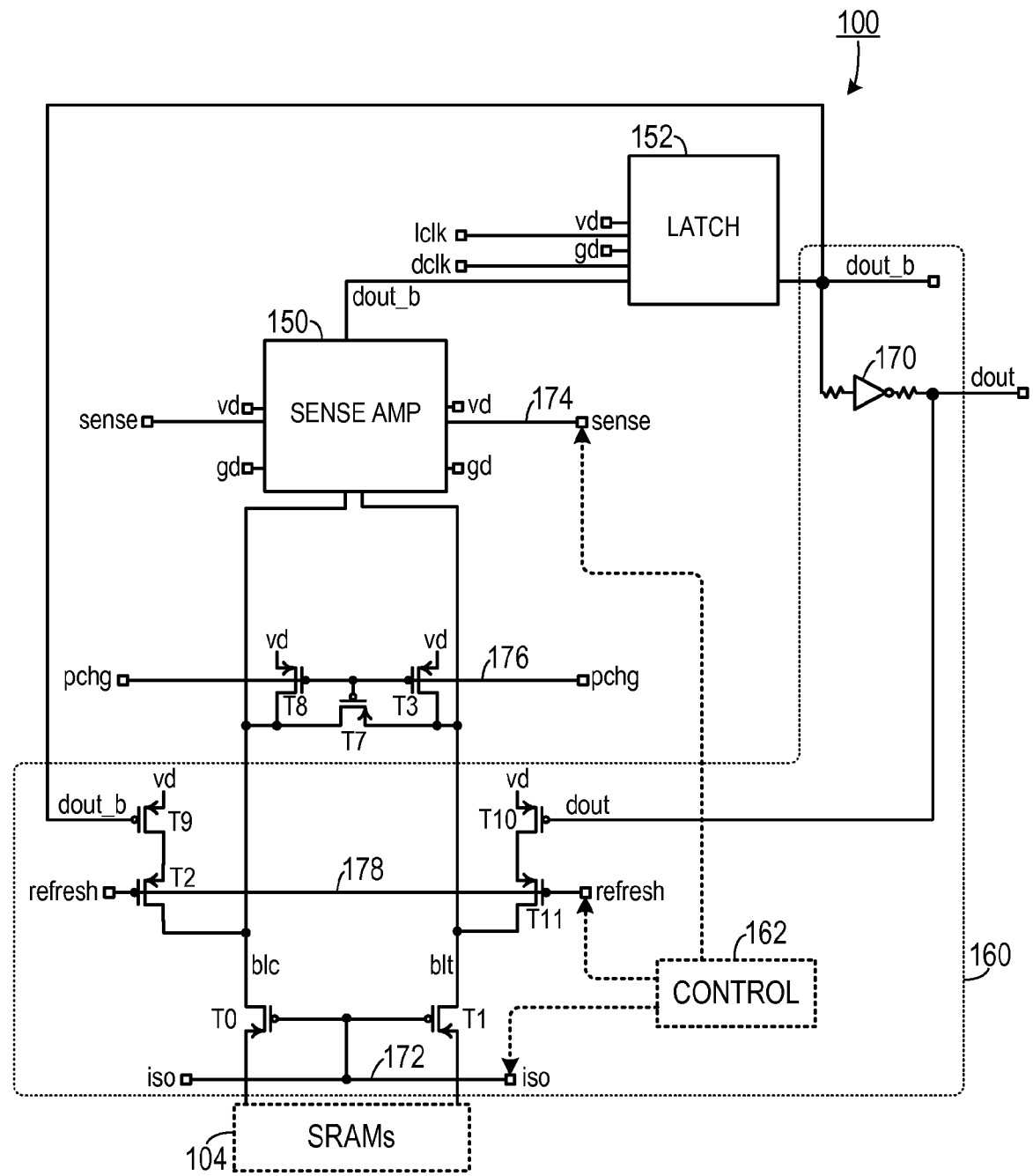
FIG. 3 is a circuit diagram showing a circuit that mitigates the hysteresis effect in a sense amplifier circuit.

One embodiment of the coupling device 160 is shown in more detail in FIG. 3. In this circuit, the signal labeled "vd" represents the system voltage and "gd" represents a ground. Also, "lclk" and "dclk" represent clocking signals. In this embodiment, the sense amplifier 150 outputs an inversion of the data value (dout_b), so the coupling device 160 includes an inverter 170 so that both the true value (dout) and a compliment of the true value (dout_b) of the data value read from the sense amplifier 150 are available.

Initially, during a read of the data source 104, the precharge signal also turns off and the control circuit 162 de-asserts an isolation signal 172, thereby causing transistors T0 and T1 to enter a conducting state. Then a sense signal 174 is asserted, causing the sense amplifier 150 to sense a voltage differential between a true data line (blt) and a complement data line (blc) from the data source 104. The sense amplifier 150 then outputs a data value (dout_b) that is latched by the latch 152.

After the sensing of data from the data source 104, a precharge signal is asserted, thereby precharging the blt and blc data lines on the sense amplifier side of transistors T0 and T1. Also, the isolation signal 172 is asserted, thereby causing transistors T0 and T1 to enter a non-conducting state.

The true data value (dout) from the inverter 170 is coupled to the gate of transistor T10 and the compliment data value (dout_b) is coupled to the gate of transistor T9. When a refresh signal 178 is asserted, transistors T2 and T11 enter a conducting state. If the value of the true data value (dout) is a logical one and the value of the compliment data value is a logical zero, then the compliment data line (blc) will receive charge from vd through transistors T9 and T2, while the true data line (blt) will float. Similarly, if the value of the true data value (dout) is a logical zero and the value of the compliment data value is a logical one, then the compliment data line (blc) will float, while the true data line (blt) will receive charge from vd through transistors T10 and T11. The sense signal 174 will be asserted and the sense amplifier 150 will sense the voltage differential between the charged blc data line and a floating blt data line as a logical zero, and will sense the voltage differential between the charged blt data line and a floating blc data line as a logical one. In either case, the sense amplifier 150 will sense a data value that is the inverse of the data value previously read from the data source 104, thereby reversing any body hysteresis in the sense amplifier 150 due to the previous read.

Once the compliment data is sensed by the sense amplifier 150, the precharge signal 176 will be reasserted. This will precharge the blt and blc data lines to prepare them for the next data read from the data source 104.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. A method of mitigating hysteresis effect in a sense amplifier circuit, comprising the actions of:
    a. sensing a data value from a data source with the sense amplifier during a first period;
    b. storing the data value in a latch;
    c. inverting the data valued stored in the latch, thereby generating an inverted data value; and
    d. isolating the data source from the sense amplifier and reading the inverted data value with the sense amplifier during a second period immediately following the first period.

2. The method of claim 1, further comprising the action of asserting a sense signal during the first period and the second period so as to cause the sense amplifier to read.

3. The method of claim 1, wherein the action of reading a data value from data source comprises the action of reading the data value from a static random access memory.

4. The method of claim 1, further comprising the action of precharging an input to the sense amplifier prior to the first period.

5. The method of claim 1, further comprising the action of precharging an input to the sense amplifier prior to the second period.

6. A method of mitigating hysteresis effect in a sense amplifier circuit, comprising the actions of:
    a. sensing a data value from a data source with the sense amplifier during a first period;
    b. storing the data value in a latch;
    c. inverting the data valued stored in the latch, thereby generating an inverted data value; and
    d. isolating the data source from the sense amplifier and reading the inverted data value with the sense amplifier during a second period immediately following the first period, wherein the sense amplifier has a first sense amplifier input and a second sense amplifier input and is configured to sense a voltage differential between the first sense amplifier input and the second sense amplifier input when a sense signal is asserted, and wherein the sense amplifier is configured to set a sensed data value to a first state when the voltage differential is greater than a predetermined threshold and is configured to set the sensed data value to a second state, different from the first state, when the voltage differential is not greater that the predetermined threshold, the first sense amplifier input being in communication with a true data signal from the data source and the second sense amplifier input being in communication with a compliment data signal from the data source.

7. The method of claim 6, further comprising the actions of:
    a. selectively coupling the true data signal to the first sense amplifier input with a first transistor; and
    b. selectively coupling the compliment data signal to the second sense amplifier input with a second transistor.

8. The method of claim 7, wherein the isolating action comprises the action of driving the first transistor and the second transistor to a non-conductive state when an isolation signal is asserted.

9. A circuit for reading a data value from a memory device that outputs a true data signal and a complement data signal, the compliment data signal corresponding to a compliment of the true data signal, comprising:
- a. a sense amplifier, responsive to a sense signal and having a first sense amplifier input and a second sense amplifier input, the sense amplifier configured to sense a voltage differential between the first sense amplifier input and the second sense amplifier input when a sense signal is asserted and configured to set a sensed data value to a first state when the voltage differential is greater than a predetermined threshold and configured to set the sensed data value to a second state, different from the first state, when the voltage differential is not greater that the predetermined threshold;
- b. a latch that is configured to store sensed data value and generate a latch output representative of the sensed data value stored therein; and
- c. a coupling device that is configured to:
  - i. couple the first sense amplifier input to the true data signal and couple the second sense amplifier input to the complement data signal during a first sense operation; and
  - ii. isolate the first sense amplifier input from the true data signal and isolate the second sense amplifier input from the complement data signal after the first data sense operation and couple the first sense amplifier input to a compliment of the latch output and couple the second sense amplifier input to the latch output after the first sense operation and prior to a subsequent data sense operation.

10. The circuit of claim 9, wherein the coupling device comprises:
- a. an isolation circuit that is configured to isolate the first sense amplifier input from the true data signal and isolate the second sense amplifier input from the complement data signal when an isolation signal is asserted;
- b. an inverted data coupling circuit that is configured to couple the first sense amplifier input to a compliment of the latch output and couple the second sense amplifier input to the latch when a refresh signal is asserted; and
- c. a control circuit that asserts the isolation signal and the refresh signal after the first sense operation.

11. The circuit of claim 10, wherein the isolation circuit comprises:
- a. a first transistor that includes a source a gate and a drain, the source and the drain each connected to a selected one of the true data signal and the first sense amplifier input and the gate connected to the isolation signal; and
- b. a second transistor that includes a source a gate and a drain, the source and the drain each connected to a selected one of the complement data signal and the second sense amplifier input and the drain connected to the isolation signal.

12. The circuit of claim 11, wherein the isolation signal is asserted with a low voltage and wherein the first transistor and the second transistor each comprise p-type field effect transistors.

13. The circuit of claim 11, wherein the isolation signal is asserted with a high voltage and wherein the first transistor and the second transistor each comprise n-type field effect transistors.

14. The circuit of claim 10, wherein the inverted data coupling circuit comprises:
- a. a third transistor that is configured to couple a power supply voltage to the first sense amplifier input when the latch output is a logical zero and configured to isolate the power supply voltage from the first amplifier input when the latch output is a logical one; and
- b. a fourth transistors that is configured to couple the power supply voltage to the second sense amplifier input when the latch output is a logical one and configured to isolate the power supply voltage from the second sense amplifier input when the latch output is a logical zero.

15. The circuit of claim 14, wherein the third transistor and the fourth transistor each comprise a p-type field effect transistor.

16. The circuit of claim 14, wherein the latch is configured to generate the latch output so as to be an inverse of the sensed data value.

17. The circuit of claim 16, further comprising an inverter that is configured to generate a compliment of the latch output.

18. The circuit of claim 17, wherein the latch output is coupled to the third transistor and the compliment of the latch output is coupled to the fourth transistor.

19. The circuit of claim 9, further comprising a precharge circuit configured to precharge both the first sense amplifier input and the second sense amplifier input during a period when the sense signal is not asserted.

* * * * *